United States Patent [19]

Ward

[11] Patent Number: 5,554,312
[45] Date of Patent: Sep. 10, 1996

[54] PHOTORESIST STRIPPING COMPOSITION

[75] Inventor: Irl E. Ward, Bethlehem, Pa.

[73] Assignee: Ashland, Dublin, Ohio

[21] Appl. No.: 374,205

[22] Filed: Jan. 13, 1995

[51] Int. Cl.$^6$ .............................. C11D 3/28; C11D 3/32; C11D 3/30; C11D 3/37

[52] U.S. Cl. .................. 510/175; 510/176; 510/254; 510/245; 510/274; 510/407; 510/499; 510/501; 510/493; 510/505

[58] Field of Search ........................... 252/544, 153, 252/542, 549, 174.21

[56] References Cited

U.S. PATENT DOCUMENTS

| | | | |
|---|---|---|---|
| 4,770,713 | 9/1988 | Ward | 134/38 |
| 5,188,675 | 2/1993 | Dormon-Brailsford | 134/40 |
| 5,417,877 | 5/1995 | Ward | 252/153 |

FOREIGN PATENT DOCUMENTS 8808445  11/1988  WIPO .

*Primary Examiner*—Erin M. Harriman
*Attorney, Agent, or Firm*—John Lezdey

[57] ABSTRACT

A non-aqueous photoresist stripping composition for effectively preventing the redeposition of alkali metal ions, particularly sodium and potassium ions, on a substrate during the stripping operation is disclosed. The stripping composition comprises:

(a) an organic polar solvent;
(b) an organic aliphatic or aromatic amine, or an organic amino alcohol; and
(c) either polyethylene glycol or polypropylene glycol in an amount to provide a caging effect. The composition also preferably includes a biodegradable organic solvent.

11 Claims, No Drawings

PHOTORESIST STRIPPING COMPOSITION

BACKGROUND OF THE INVENTION

1. Field of the Invention

This invention relates to stripping compositions especially useful for photoresist stripping of solid-state integrated circuit components from a substrate, and more particularly, a stripping composition that prevents redeposit of alkali metal ions onto the substrate.

2. Description of the Prior Art

The manufacture of solid-state integrated circuits comprises process steps which include coating onto the surfaces of wafer substrates such as metals, dielectrics and organic polymeric materials to protect areas in the wafer surface that define circuitry patterns. Later in the process it becomes necessary to remove these materials. Numerous compositions have been developed for stripping these organic photoresist polymers from silicon dioxide or other insulator surfaces. The photoresist strippers generally used include compositions comprising mixtures of organic sulfonic acid, phenol and chlorinated hydrocarbon solvents.

A further description of these stripping compositions is found in U.S. Pat. No. 4,165,295, which is incorporated herein by reference. However, the compositions described therein pose grave health and environmental problems. The toxicity and pollution problems arising from the use and disposal of phenol, phenolic derivatives and chlorinated hydrocarbon compounds makes it desirable to provide a suitable replacement.

Phenol-free and chlorinated hydrocarbon-free stripping compositions are described in U.S. Pat. Nos. 4,770,713 and 4,992,108, both to Ward, which are incorporated herein by reference. These compositions provide a non-aqueous biodegradable photoresist stripping combination that can be rinsed with deionized water. Additional biodegradable solvents may also be added.

U.S. Pat. No. 4,636,441 to Sirinyan, et al, which is herein incorporated by reference, discloses the use of crown ether complexes with noble metals in an activation solution to enhance the adhesion strengths of metals deposited on the printed circuit boards. This patented process involves a pretreatment of the substrate board with the crown ether complex before electroless metallization. No specific stripping compositions are disclosed.

A key problem with the use of current stripper compositions is the redeposition of alkali metal ions on the surface of the insulator substrate, such as $SiO_2$, TEOS, BPSG, etc. In amounts as small as 5 parts per billion, the alkali ion interferes with the electrical properties and deposition of conductor metals at the metal-dielectric interface. This is troublesome in the manufacture of high density integrated circuits, such as, sub-micron connect lead geometrics patterned over dielectrics or "VIA" metal-2 properties connecting with metal-1 over a dielectric "VIA"-hole.

Consequently, while the art of photoresist stripping compositions and methods of stripping are well developed, a need remains for a composition that reduces alkali metal ion concentration on the surface of the dielectric layer of an integrated circuit.

OBJECT OF THE INVENTION

It is an object of this invention to provide a non-aqueous biodegradable photoresist stripping composition that prevents the redeposition of alkali metal ions on the surface of a substrate, and more particularly, on the surfaces of fabricated l.c. wafer substrates such as metals, dielectrics, doped substrates, semiconductors, et al.

It is another object of this invention to provide a photoresist stripping solution that is essentially free of phenol, phenolic compounds and chlorinated hydrocarbon compounds.

It is a further object of this invention to provide a non-aqueous biodegradable photoresist stripping composition that can be used at low temperatures and over a wide range of operating conditions.

It is yet another object of this invention to provide a method for removing photoresist coatings from printed circuit boards and l.c. wafers without redeposition of alkali metal ions on the surface of the printed circuit or l.c. wafer.

SUMMARY OF THE INVENTION

Accordingly, it has been found that the redeposition of alkali metal ions can be reduced on the surface of various substrates, such as dielectric l.c. layers, semiconductors, et al., when such surfaces, which have been processed in the customary manner, are treated with a photoresist stripping composition containing polyethylene glycol or polypropylene glycol in an amount to provide a conformable "caging" effect.

The stripping composition comprises a mixture of:

(a) from about 30 to about 96 weight percent of an organic polar solvent, such as a, N,N-diakylalkanoylamide, N-alkyl lactam, lactone, acetate ester of ethylene glycol ether, acetate ester of propylene glycol ether, aliphatic amide, cyclic heterocycles, cyclic aliphatic sulfone, ester of dibasic acid, cyclic ketone, sulfoxide, ether alcohol and mixtures thereof.

(b) from about 4 to 70 weight percent of an organic aliphatic or aromatic amine, or an amino alcohol of the general structures:

$R_1$—$NHR_2$ or

HO—$R_1$—$NHR_2$;

wherein $R_1$ is selected from phenyl, lower alkyl and lower alkoxy and $R_2$ is selected from hydrogen, lower alkyl, lower alkoxy and lower alkanol.

(c) Polyethylene glycol or polypropylene glycol having an average molecular weight of about 400 to 1000 in an amount to provide a caging effect. That is, less than 1.0 weight percent and more than 0.01 weight percent.

The stripping compositions of this invention are employed at temperatures of about 100° C. or less.

The stripping composition of this invention, unlike conventional stripping compositions, prevents alkali metal ions, particularly sodium and potassium ions, from redepositing on the given substrate. The stated ranges of chemicals described herein are critical to the workings of the invention. Higher or lower amounts of glycol could cause the loss of the caging effect because the chemicals would then be acting more as a solvent, than as a complexing agent.

DETAILED DESCRIPTION OF THE INVENTION

The present invention provides a photoresist stripping composition which is effective in preventing redeposition of alkali metal ions on a substrate. The composition is biodegradable, has low toxicity and can be used over a wide range of operating conditions.

In one embodiment of the invention, the stripping composition comprises an organic polar solvent such as N,N-dimethylacetamide, an organic aliphatic or aromatic amine or an organic amino alcohol, and either polyethylene glycol or polypropylene glycol in an amount to provide a caging effect.

The organic polar solvents touch a broad range of classes, including N,N-diakylalkanoylamides, N-alkyl lactams, lactones, acetate esters of ethylene glycol ethers, acetate esters of propylene glycol ethers, aliphatic amides, cyclic aliphatic sulfones, esters of dibasic acids, cyclic ketones, sulfoxides, ether alcohols and mixtures thereof. Advantageously, useful solvents include dimethyl sulfoxide, N,N-dimethylacetamide, N-methyl- 2-pyrrolidinone, γ-butyrolactone, isophorone, carbitol acetate, methyl acetoxypropane, aliphatic amides, cyclic heterocyclics, dimethyl adipate, dimethyl glutarate, tetrahydrofuryl alcohol, and the like.

Preferably, the amine or amino compound used in the invention is chosen from monoethanol amine, IPAM, isopropanolamine 2-(2-aminoethoxy)ethanol and 2-(2-aminoethylamino)ethanol.

Other biodegradable solvents may be added to the stripping composition without adversely effecting the stripping performance or the redeposition of the alkali metal ions.

Due to their chemical and/or physical natures, polyalkene glycols make suitable host molecules to metal ions. In the presence of ionic alkali compounds, small amounts of polyethylene glycol and polypropylene glycol assume the shape required for the formation of a complex or adduct that builds a "cage" around the metal ion. In other words, the cage or hole size of these glycols accommodates the ionic diameter of the alkali metal. Amounts greater than about 1.0% by weight results in a solvent action which destroys the caging effect.

The stripper compositions of the invention can contain sodium ions in a concentration of about 1–5,000 parts per billion. This results in a sodium ion concentration on the treated substrate of about $1\times10^{13}$ ions/cm$^2$ to about $2\times10^{14}$ ions/cm$^2$ as measured by SEMS. At these concentrations, the alkali metal ion, particularly the sodium ion, deleteriously affects the solid-state properties of the circuit board pattern. Ideally, these ions should be completely removed for the surface of the substrate. The composition of the invention reduces the sodium ion concentration on the surface of the substrate without reducing the sodium levels in the stripper composition.

The stripping composition is used to clean coated substrates such as a printed circuit board or a fabricated l.c. wafer. Preferable wafers include metals, dielectrics, doped substrates and semiconductors. The substrates are usually coated with a photoresist.

The polymeric organic substrates that are to be removed by the stripping composition of this invention are usually photoresists. These photoresists are applied to a substrate, such as silicon dioxide, silicon or aluminum. Portions of the substrate are masked and the masked substrate is exposed to light. The unexposed masked portions of the photoresist are removed by solvent development. This leaves a pattern, for example, a portion of a solid-state circuit pattern, on the exposed substrate. The remaining exposed photoresist is then baked for further hardening and the portion of the substrate which is not covered by the photoresist is etched or otherwise treated. The etchant may be a buffered oxide, acid or plasma, which may further harden the photoresist. The hardened photoresist must then be removed before the substrate can be further processed or used. In employing the stripping solutions of this invention, the substrate covered with the baked photoresist is contacted with the stripping solutions at a temperature of from about 25° C. to about 100° C., preferably between 50° C. and 85° C.

The period required for stripping the photoresist may vary to an extent depending on the specific polymer used in the photoresist and the processing conditions. Generally, the time involved will be between 5 and 30 minutes, although some resists, depending upon the bake temperature, may require 40 minutes or longer before the polymeric photoresist is removed from the substrate. It should be appreciated that many photoresists are completely dissolved from the substrate, while others may be loosened or floated off and then dissolved in the stripping composition.

After the photoresist has been stripped off the substrate, the substrate is washed with an aqueous rinsing liquid. A solvent rinse may follow the stripping step, with solvents such as isopropanol, N-methyl-2-pyrrolidinone, et al. Since, however, the present compositions are substantially water rinseable, it is acceptable to directly rinse in deionized water after stripping, using water of the purity commonly found in semiconductor processing.

The stripping compositions of this invention are especially useful and advantageous for numerous reasons. For example, the stripping compositions are water rinseable, low corrosive, non-flammable and of low toxicity to humans and environment. Because of low ambient vapor pressure, the composition evidence substantially less evaporation than prior compositions and are non-reactive and environmentally compatible. Thus, the stripping compositions may be recycled for multiple use or easily disposed of in an environmentally safe manner without the necessity for burdensome safety precautions.

The stripping compositions of this invention evidence higher stripping efficiency at lower temperatures for a wide variety of coatings and substrates. Moreover, the stripping compositions are easily prepared by simply mixing the components at room temperature and thus, require no special human or environmental safety precautions. Furthermore, the components of the stripping compositions of this invention provide synergistic stripping action and permit readily and substantially complete removal of coatings from substrates.

The effectiveness and unexpected nature of the stripping compositions of this invention is illustrated, but not limited, by the data presented in the following examples.

EXAMPLE I

A photoresist composition comprising 80 weight percent N,N-dimethylacetamide and 20 weight percent monoethanol amine is mixed at room temperature.

EXAMPLE II

To 1 gallon of the photoresist composition of Example 1, polyethylene glycol is added and stirred at room temperature to yield a concentration of about 0.1 weight percent of the polyethylene glycol in the product.

In order to demonstrate the efficiency of the polyethylene glycol to prevent redeposition of alkali metal ions the following tests were performed. Metal substrates containing commercial photoresists were post-baked. The substrates were cooled and dipped into a vessel containing a stripping composition of the present invention maintained at 65° C. and stirred with a magnetic stirrer. The substrate was removed and dipped into a bath containing isopropyl alcohol maintained at room temperature for 1 minute and then rinsed with deionized water. The results were as follows:

TABLE I

|  | Initial [Na+] |  | [Li+] | [Na+] | [K+] |
|---|---|---|---|---|---|
| Ex. 1 | 2–5 ppb | — | 9.2E9 | 2.7E13 | 3.9E13 |
| Ex. 2 | 2–5 ppb | polyethylene glycol |  |  |  |
| % Improvement |  |  |  |  |  |

E = power of 10

The results show that the complex formation of alkali metal ions with polyethylene glycol prevents alkali metal ion redeposition on the surface of substrates.

EXAMPLE III

The following tests were performed to determine the caging effect at different concentrations. The substrates were tested according to the procedure of Example II and tested for sodium ion concentrations less than $2 \times 10^{14}$ ions/cm$^2$

| Polar Solvent Wt % | Amine Wt % | Glycol Wt % | Conc. of Na+ less than $2 \times 10^{14}$ ions/cm$^2$ |
|---|---|---|---|
| 1. N,N-dimethyl acetamide | methanol-amine | Poly-propylene glycol |  |
| 79.9 | 20 | 0.1 | yes |
| 79.0 | 20 | 1.0 | yes |
| 77.0 | 20 | 3.0 | no |
| 2. N-methyl-2-pyrrolidinone | methanol-amine | Poly-ethylene glycol |  |
| 79.9 | 20 | 0.1 | yes |
| 79.0 | 20 | 1.0 | yes |
| 77.0 | 20 | 3.0 | no |

What is claimed is:

1. A stripping composition comprising a mixture of
   a) from about 30 to 96 weight percent of an organic polar solvent selected from the group consisting of N,N-dialkylalkanoylamide, N-alkyl lactams, lactones, acetate esters of ethylene glycol ethers, acetate esters of propylene glycol ethers, aliphatic amides, cyclic, aliphatic sulfones, esters of dibasic acids, cyclic ketones, sulfoxides, ether alcohols and mixtures thereof;
   b) from about 4 to 70 weight percent of an organic aliphatic or aromatic amine of the general formula of $R_1$—NH—$R_2$, or an organic amino alcohol of the general formula of OH—$R_1$—NH—$R_2$ or mixtures thereof, wherein $R_1$ is selected from the group consisting of phenyl, lower alkyl and lower alkoxy and $R_2$ is selected from the group consisting of hydrogen, lower alkyl, lower alkoxy and lower alkanol;
   c) a glycol selected from the group consisting of polyethylene glycol, polypropylene glycol and mixtures thereof in an amount of less than 1.0 weight percent and more than 0.01 weight percent to provide a conformal caging effect, said glycol having an average molecular weight of 400 to 1,000.

2. The stripping composition as recited in claim 1, wherein said N,N-dialkylalkanoylamide is N,N-dimethylacetamide.

3. The stripping composition as recited in claim 1, wherein said solvent is N-methyl-2-pyrrolidinone.

4. The stripping composition as recited in claim 1, wherein said lactone is γ-butyrolactone.

5. The stripping composition as recited in claim 1, wherein said acetate ester of ethylene glycol ether is carbitol acetate.

6. The stripping composition as recited in claim 1, wherein said amine compound is selected from the group consisting of monoethanol amine and isopropanolamine.

7. The stripping composition as recited in claim 1, wherein said amino alcohol compound is selected from the group consisting of 2-(2-aminoethoxy)ethanol and 2-(2-aminoethylamine)ethanol.

8. The stripping composition of claim 1, wherein said glycol is polyethylene glycol.

9. The stripping composition of claim 1, wherein said glycol is polypropylene glycol.

10. The stripping composition as recited in claim 1 wherein said organic polar solvent is N,N-dimethylacetamide, said amine is monoethanolamine and said glycol is polyethylene glycol.

11. The stripping composition as recited in claim 10 comprising about 79.9 weight percent of said N,N-dimethylacetamide, 20 weight percent of said monoethanolamine and about 0.1 weight percent of said polyethylene glycol.

* * * * *